THRESHOLD CIRCUIT UTILIZING FIELD EFFECT TRANSISTORS

Filed March 19, 1964 2 Sheets-Sheet 1

INVENTORS
JOSEPH R. BURNS &
BY ROBERT A. POWLUS
John V. Regan
Attorney

INVENTORS
JOSEPH R. BURNS &
ROBERT A. POWLUS
BY John V. Regan
Attorney

United States Patent Office 3,260,863 Patented July 12, 1966

3,260,863
THRESHOLD CIRCUIT UTILIZING FIELD EFFECT TRANSISTORS

Joseph R. Burns, Trenton, N.J., and Robert A. Powlus, Yardley, Pa., assignors to Radio Corporation of America, a corporation of Delaware Filed Mar. 19, 1964, Ser. No. 353,146
6 Claims. (Cl. 307—88.5)

This invention relates to threshold circuits, and more particularly to threshold circuits which utilize insulated-gate field-effect transistors as the active elements therein.

A threshold circuit, as the term is used herein, is a circuit which produces an output signal of one, or another, signal level when the input signal level is respectively greater than, or less than, a predetermined threshold level. Threshold circuits are useful for performing logic operations in digital data processing systems, such as in majority or minority gate logic circuits.

It is an object of this invention to provide a new and improved threshold circuit which includes field-effect transistors.

It is another object of this invention to provide a new and improved threshold circuit which exhibits substantially no steady-state power dissipation.

A threshold circuit in accordance with the invention includes a pair of field-effect transistors of opposite conductivity types. Each of the transistors includes first and second electrodes separated by a channel, which defines a conductive path for the transistors, and a control electrode which controls by field effect the conductance of the channel. The first-to-second electrode conductive paths of the transistors are serially connected toegther across a source of energizing potential so that one transistor functions as a load on the other. The control electrodes of the transistors are directly connected to each other so as to provide a common biasing terminal for both transistors. Input signals are coupled to the common biasing terminal of the transistors while output signals are derived from the junction of the conductive paths of the transistors. The output signals exhibit an abrupt change from one signal level to another when the input signal level exceeds a predetermined threshold level.

Figure 1:
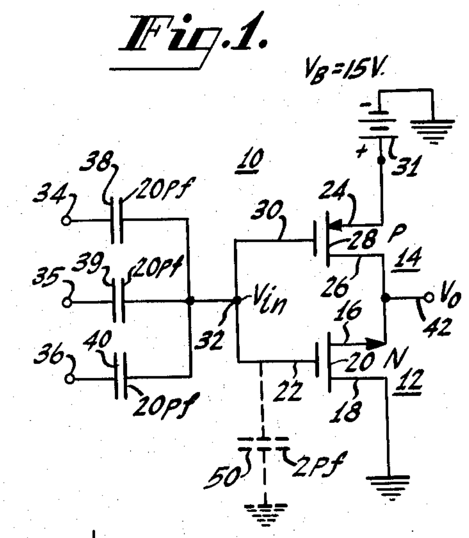
FIGURE 1 is a schematic circuit diagram of a threshold circuit which is operated as a minority gate.

Referring now to FIGURE 1, a threshold circuit 10 includes a pair of insulated-gate field-effect transistors 12 and 14. The transistor 12 may be, for example, of the N-type conductivity, whereas the transistor 14 is of the opposite type, or P-type conductivity. The transistor 12 includes first drain and second source electrodes 16 and 18, respectively, formed in space relation to each other on a substrate (not shown) and connected to each other by a channel 20 whose conductance may be controlled. A gate or control electrode 22, insulated from the channel and the substrate, is formed between the drain and source electrodes 16 and 18 to control the conductance of the channel 20 and thereby control the current flow between the drain 16 and source 18 electrodes. The insulated-gate field-effect transistors 12 and 14 may be either metal oxide semiconductor (MOS) transistors or thin film transistors. Such transistors have been described in the literature. For example, MOS transistors are described in an article entitled "The Silicon Insulated-Gate Field-Effect Transistor" by S. Hofstein et al. in the September 1963, Proceedings of the IEEE, beginning on page 1190, and thin film transistors are described in an article entitled "The TFT—A New Thin-Film Transistor" by P. K. Weimer in the June 1962, Proceedings of the IRE, beginning on page 1462. Even though either MOS or TFT transistors may be utilized in practicing the invention, the specification will refer only to MOS transistors for convenience in description.

Figure 2:
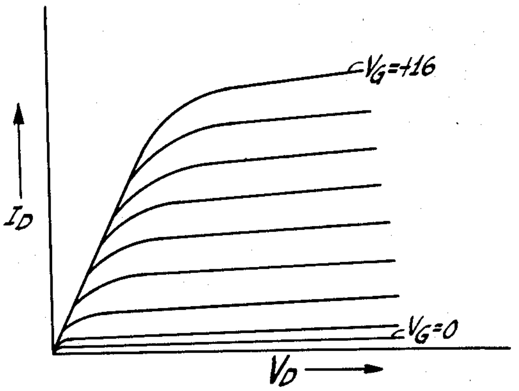
FIGURE 2 is a current-voltage characteristic of an insulated-gate field-effect transistor of N-type conductivity.

The drain current $I_D$-drain voltage $V_D$ characteristic curves of a typical enhancement type MOS transistor of the N-type conductivity is shown in FIGURE 2. In MOS transistors (the current flows in the channel between the drain and source electrodes without crossing a rectifying junction. For a given drain voltage, the amount of current flow in an N-type transistor increases from source-to-drain for increasing positive values of gate bias voltages $V_G$. At low or zero gate bias voltage, there may be substantially no current flow for values of drain voltage below breakdown other than a small leakage current. P-type MOS transistors exhibit a similar characteristic to that shown in FIGURE 2 except that the polarities of the voltages and direction of current flow are reversed.

The second field-effect transistor 14 in FIGURE 1 also includes drain 24 and source 26 electrodes separated by a channel 28 whose conductance is controlled by a gate electrode 30. The channel conductive paths of the transistors 12 and 14 are serially connected together by connecting the drain 16 of the transistor 12 to the source 26 of the transistor 14. The transistors 12 and 14 are energized by a source of energizing potential $+V_B$, shown in FIGURE 1 as a battery 31. The drain 24 of the transistor 14 is coupled to the positive terminal of the battery 31 while the source 18 of the transistor 12 is connected to the negative terminal of the battery 31 through a circuit ground connection. The gate electrodes 22 and 30 of the transistors 12 and 14, respectively, are coupled directly together to provide a common gate biasing terminal or an input junction terminal 32. Input terminals 34, 35 and 36 are also provided for the threshold circuit 10 and are individually coupled to the input junction terminal 32 through capacitors 38, 39 and 40, respectively. A terminal 42 is coupled to the junction of the transistors 12 and 14 to provide an output terminal for the threshold circuit 10. The threshold circuit 10 exhibits between the terminal 32 and ground a capacitance to ground, or an input capacitance, which is represented by the dotted capacitor 50. The values of the components utilized in the circuit 10 are shown in FIGURE 1.

The input capacitance exhibited by the threshold circuit 10 permits the input signals to be capacitively coupled through the capacitors 38–40 without detrimentally increasing the response time of the circuit 10 for step input signals. With the same voltage $V_1$ applied to each input terminal 34, 35 and 36, the three capacitors 38, 39 and 40 are effectively connected in parallel and exhibit an equivalent capacitance C. A step input signal, which is applied to the serially connected equivalent capacitor C and the capacitor 50, produces at the input junction terminal 32, a voltage $V_{in}$ equal to (1)
$$V_{in}=V_1\times\left(\frac{1}{1+\frac{C_{50}}{C}}\right)$$

wherein $C_{50}$ is the capacitance exhibited by the capacitor 50. By selecting the capacitors 38–40 to be substantially greater than the capacitor 50 so that C is much greater than $C_{50}$, the voltage $V_{in}$ at the junction 32 becomes substantially equal to the voltage $V_1$. Thus, it is seen that there is little voltage attenuation by the capacitor 50 and substantially the entire input voltage appears at the input junction terminal 32. Furthermore, the capacitors 38–40 provide the necessary voltage division for differing threshold levels when the voltages applied to the input terminals 34–36 are not all equal. The voltage appearing at the junction 32 for a plurality of $n$ input signals is defined by the equation $$V_{in} \cong \frac{1}{n}(V_1 + V_2 + \ldots + V_n) \tag{2}$$

where $V_1$, $V_2$ are the voltages at successive input terminals and are limited to either $+V_B$ or zero volts, and $n$ equals the number of input signals. For the three input gate shown in FIGURE 1, Equation 2 reduces to $$V_{in} \cong \frac{1}{3}(V_1 + V_2 + V_3) = \frac{V_B}{3} \tag{3}$$

when one input signal is applied thereto. Thus, it is apparent that the capacitors 38, 39 and 40 provide the necessary voltage division of the applied input signals for threshold level input signals.

Figure 3:
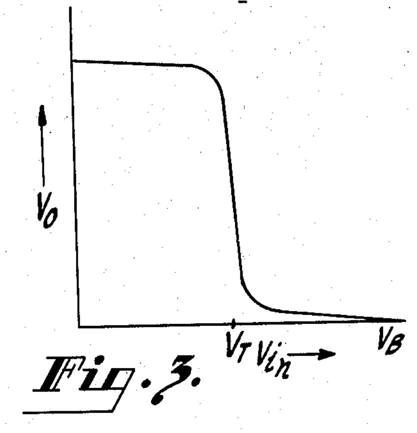
FIGURE 3 is a graph illustrating the threshold characteristic of the circuit of FIGURE 1.

The input-output or transfer characteristic of the threshold circuit 10 is shown in FIGURE 3. In this graph, the voltage at the junction point 32 is plotted as $V_{in}$ and the output voltage at the terminal 42 is plotted at $V_o$. For input voltages $V_{in}$ up to a predetermined threshold level $V_T$, the output voltage $V_o$ is substantially constant at a high level, which level is substantially equal to the energizing voltage $V_B$. However, for input voltages $V_{in}$ above the threshold level $V_T$, the output voltage $V_o$ drops to a low level which is substantially zero. Thus, the threshold circuit 10 is also an inverter. The input and output voltages are considered to be binary "1's" when at the high level $V_B$ and binary "0's" when equal to zero volts.

The threshold voltage $V_T$ occurs at one-half the magnitude of the energizing voltage $V_B$ for transistors 12 and 14 which exhibit substantially similar characteristics. When the transistors 12 and 14 have dissimilar characteristics, the energizing source 31 is selected to cause the threshold voltage $V_T$ to occur substantially at the midpoint of the graph of FIGURE 3.

Referring back to FIGURE 1, the operation of the threshold circuit 10 will now be described. When no input signals are applied to the input terminals 34–36, the input voltage $V_{in}$ is zero and the output voltage $V_o$ is substantially at the $V_B$ level. This may be seen from the graph in FIGURE 4. With no input signals, the gate bias voltage on the transistor 12 is zero. Thus, the transistor 12 exhibits the current-voltage characteristic denoted by the solid line curve 52 in FIGURE 4. This is a typical characteristic of an N-type transistor with zero gate bias voltage applied thereto. By the serial connection of the transistors 12 and 14 across the energizing source 31, the transistor 14 functions as a load on the transistor 12. Therefore, the characteristic of the transistor 14 is drawn as the dotted load line 54 in FIGURE 4. The zero gate bias voltage at the common terminal 32 is effectively a large enhancing bias for the P-type transistor 14. This is because the source electrode 26 of the transistor 14 is at a positive potential substantially equal to the supply voltage $V_B$ due to the large impedance exhibited by the N-type transistor 12. Since the gate 30 is at zero volts, the gate-to-source bias for the transistor 14 is effectively $-V_B$ volts. Therefore, the P-type transistor 14 exhibits the load line 54 in FIGURE 4. The intersection of the curves 52 and 54 at the point A denotes the voltage across the N-type transistor 12 or the output voltage $V_o$. This voltage $V_o$ is substantially equal to the energizing voltage $V_B$. Thus, with three input signals of binary "0" values, the output signal of the threshold circuit 10 of the binary "1" value. This provides an inversion of the input signals.

Figure 4:
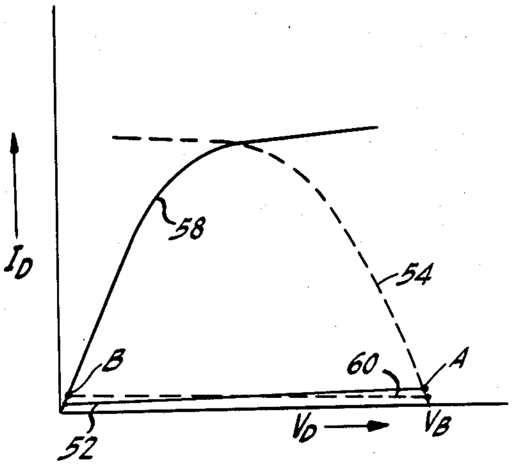
FIGURE 4 is a graph which is helpful in explaining the operation of the circuit of FIGURE 1.

When three binary "1" input signals, each of $+V_B$ value, are applied to the input terminals 34–36, the voltage $V_{in}$ is approximately equal to $V_B$ and the output voltage $V_o$ is a binary "0." With such a high enhancing gate bias, the transistor 12 exhibits the solid line characteristic 58 in FIGURE 4. However, the load exhibited by the transistor 14 is substantially that of a transistor with no gate bias voltage, i.e., the dotted curve 60 in FIGURE 4. The intersection of the curves 58 and 60 at the point B denotes the voltage across the N-type transistor 12. This voltage is substantially zero.

When one binary "1" and two binary "0" input signals are applied to the circuit 10, the input voltage $V_{in}$ at the junction 32, in accordance with Equation 3, is $V_B/3$. This is below the threshold voltage $V_T$ in FIGURE 3 which is approximately $V_B/2$ so the output voltage is still a binary "1". It will be shown subsequently that the operating point for this condition is at the point A.

When two binary "1" and one binary "0" input signals are applied to the circuit 10, the voltage $V_{in}$ becomes $\frac{2}{3}V_B$ which is above the threshold level $V_T$ of FIGURE 3. Therefore, the output voltage $V_o$ becomes zero. It will be shown subsequently that the operating point for this condition is at the point B.

Figure 5:
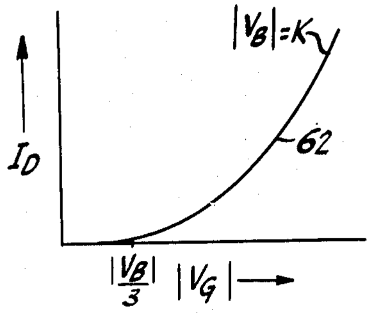
FIGURE 5 is a transfer characteristic of a field-effect transistor which may be utilized in practicing the invention; and, FIGURE 6 is a schematic circuit diagram of a full adder embodying the invention.

The threshold circuit 10 is essentially a minority gate wherein the output exhibits a binary value which is equal to the binary value of a minority of the input signals. The threshold circuit 10 also exhibits little power dissipation in steady-state operation because substantially no current flows during this time. It is to be noted that for both the operating points A and B of FIGURE 4, the current is very low equaling only the small leakage current of the transistors 12 and 14. Since the transistors 12 and 14 are connected in series and are biased by the same gate voltage (i.e., the voltage $V_{in}$), a biasing voltage which tends to cause one transistor to conduct heavily simultaneously biases the other transistor to cutoff. This is true even for the conditions wherein either one binary "1" input signal or two binary "1" input signals are applied to the circuit 10. The operating points for these two input conditions are also A and B, respectively, because the transistors 12 and 14 are selected to exhibit a transfer characteristic 62 such as that shown in FIGURE 5. It is to be noted that in a transistor having such a transfer characteristic, the drain current $I_D$ does not flow until the absolute magnitude of gate voltage $|V_G|$ exceeds a selected magnitude approximately $$\frac{|V_B|}{3}$$

It is to be recalled that this magnitude is the value of the voltage appearing at the junction 32 for one binary "1" input signal. Thus, substantially no current flows through the transistors 12 and 14 for the steady-state operating positions because drain current which would be produced by one binary "1" input signal is blocked by the transistor 12, wherein drain current which would be produced by two binary "1" input signals is blocked by the transistor 14.

When the transistors 12 and 14 switch from operation at the point A to operation at the point B, a substantial current flows momentarily. The transistors 12 and 14 switch from operation at the point A to operation at the point B when the voltage at the junction 32 biases the transistors 12 and 14 at points which tend to cause equal currents to flow through the transistors 12 and 14. As stated previously, this transition occurs at substantially one-half the energizing voltage $V_B$ for transistors with similar characteristics.

The use of the input capacitors 34–36 prevents steady-state power dissipation. The capacitors 34–36 block all direct current but still provide the necessary voltage division of the direct voltage, as shown previously by the Equation 1. Low power dissipation is important in integrated circuits whereby many threshold circuits 10 are interconnected. For example, avoidance of heat generation due to current flow makes integrated circuit operation more reliable. By avoiding resistive input connections the response time of the circuit 10 to input signals is decreased and losses due to steady-state direct current flow are prevented.

Figure 6:
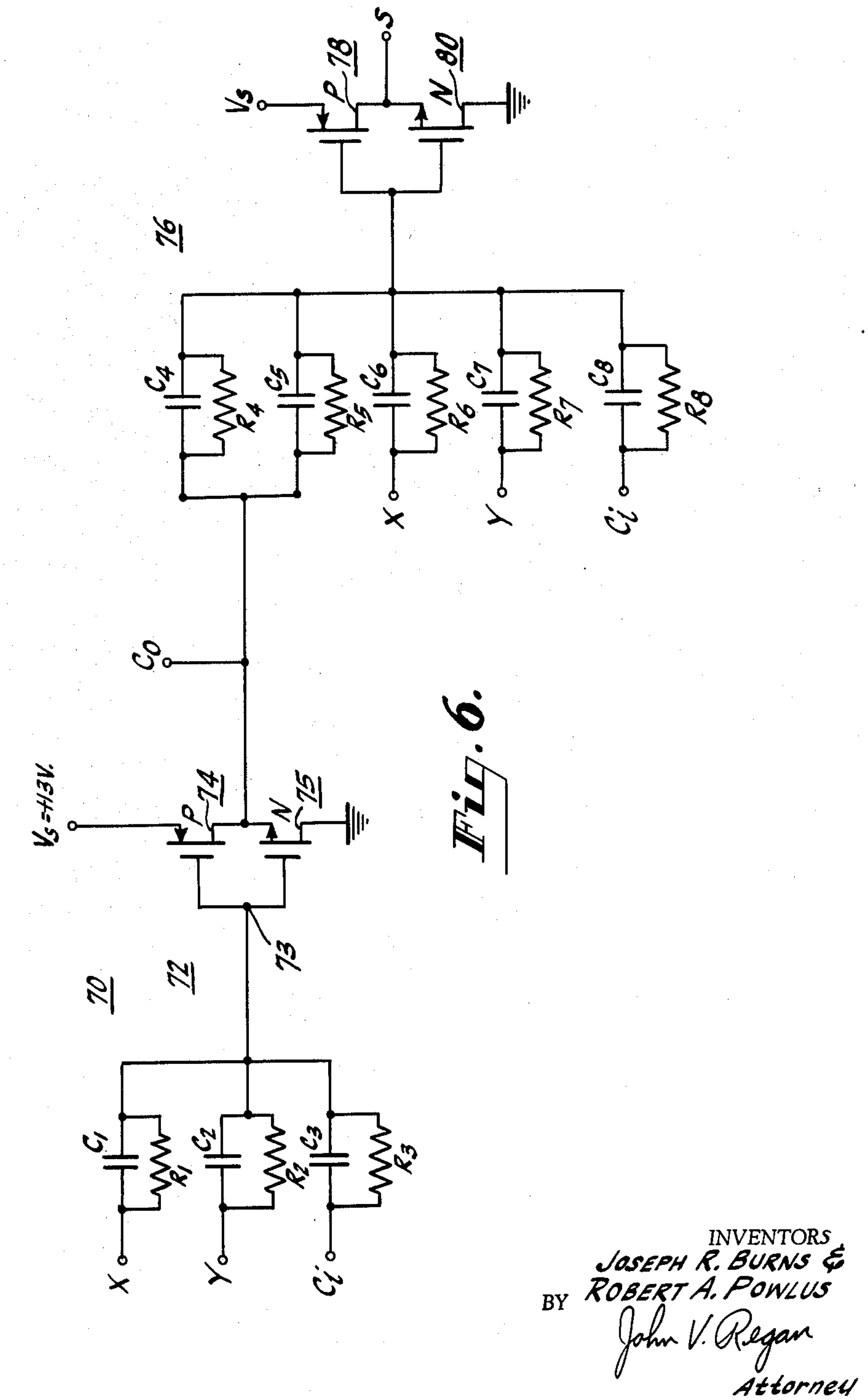

Referring now to FIGURE 6, there is illustrated a full adder circuit 70 which utilizes a three-input minority gate 72 and a five-input minority gate 76. The input terminals X, Y and C of the threshold minority gate 72 have applied thereto X, Y, and $C_i$ input signals which correspond, respectively, to addend, augend, and carry signals. The output terminal $C_o$ provides an inverted output carry signal. Each input signal is coupled through a separate parallel combination of a capacitor C and a resistor R to a junction 73. The capacitors C and resistors R in FIGURE 6 are subscripted 1 through 8, respectively. The resistors R represent the high leakage resistance exhibited by either a deposited capacitor in an integrated circuit or an imperfect capacitor in a lumped circuit. The capacitors C and the resistors R may, for example, be 220 picofarads and 1.5 megohms, respectively. The junction 73 is coupled to the gate electrodes of a P and an N-type conductivity field-effect transistors 74 and 75 serially connected across the power supply $C_S$ of 13 volts.

The carry output terminal $C_o$ of the gate 72 is connected to provide two input signals to the second threshold circuit 76. Additionally, the addend and augend inputs X and Y as well as the carry signal $C_i$ are also coupled to the inputs of the gates 76. All of the input signals to the gate 76 are coupled in a manner identical to the input signals to the gate 72. The gate 76 therefore comprises a five-input minority gate. The gate 76 also includes P and N-type transistors 78 and 80 serially connected across the energizing supply $V_S$ and biased by the input signals. An inverted sum output is derived from the output terminal S of the gate 76.

The operation of the full adder 70 is described in conjunction with the Truth Table for this circuit which is designated Table I below. A signal level of 13 volts is a binary "1," whereas zero volts is a binary "0."

*Table I*

| Inputs | | | Outputs | |
|---|---|---|---|---|
| X | Y | $C_i$ | Sum ($\bar{S}$) | Carry ($\bar{C}_o$) |
| 0 | 0 | 0 | 1 | 1 |
| 1 | 0 | 0 | 0 | 1 |
| 0 | 1 | 0 | 0 | 1 |
| 0 | 0 | 1 | 0 | 1 |
| 1 | 1 | 0 | 1 | 0 |
| 1 | 0 | 1 | 1 | 0 |
| 0 | 1 | 1 | 1 | 0 |
| 1 | 1 | 1 | 0 | 0 |

When no input signals are applied to the first threshold gate 72, a binary "1" output is derived from the carry output terminal $\overline{C_o}$ because of the inverting property of the minority gate 72. Two binary "1" signals are therefore applied from the terminal $\overline{C_o}$ to the gate 76. However, these two signals are a minority so the output at the terminal S is a binary "1."

When one binary "1" is applied to the gate 72, the output is a binary "1" since this is the minority binary value. However, the two binary "1" signals thereupon applied to the minority gate 76 added to the initial binary "1" signal and make the binary "0" signals the minority signals. A binary "0" is therefore derived from the output terminal S. The remaining conditions are believed to be self-explanatory in view of the above description and the Table I.

What is claimed is:

1. A threshold circuit comprising, in combination,
a pair of field-effect transistors of opposite conductivity types with each having first and second electrodes separated by a channel defining a conductive path for said transistors, and a control electrode for controlling the conductance of said channel,
means for directly connecting together the control electrodes of said transistors,
means for serially connecting together the first-to-second electrode conductive paths of said transistors so that one transistor functions as a load on the other,
means for capacitively coupling input signals to the junction of the control electrodes of said pair of transistors, and
means for deriving output signals from the junction of said first-to-second electrode conductive paths of said pair of transistors,
said output signals exhibiting an abrupt change from one signal level to another when said input signals exceed a predetermined threshold signal level.

2. A threshold circuit comprising, in combination,
a pair of field-effect transistors of opposite conductivity types with each having first and second electrodes separated by a channel defining a conductive path for said transistors, and a control electrode for controlling the conductance of said channel.
means for directly connecting together the control electrodes of said transistors,
a source of energizing potential,
means for serially connecting together the first-to-second electrode conductive paths of said transistors across said energizing potential source so that one transistor functions as a load on the other,
means for capacitively coupling input signals to the junction of the control electrodes of said pair of transistors, and
means for deriving output signals from the junction of said first-to-second electrode conductive paths of said pair of transistors,
said output signals exhibiting an abrupt change from one signal level to another when said input signals exceed a predetermined threshold signal level.

3. A logic gate comprising, in combination,
first and second field-effect transistors of opposite conductivity types with each having drain and source electrodes separated by a channel defining a conductive path for said transistors, and a control electrode for controlling the conductance of said channel,
means for serially connecting together the drain-to-source electrode conductive paths of said transistors so that one transistor functions as a load on the other,
means for directly coupling together the control electrodes of said transistors so as to provide a common bias terminal for said transistors,
a plurality of input terminals,
a plurality of capacitors individually connecting an input terminal to said common bias terminal,
means for applying a plurality of binary input signals to said input terminals, and
means for deriving from the junction of said drain-to-source electrode conductive paths of said transistors an output signal having a binary value equal to the binary value of a minority of input signals.

4. A logic gate comprising, in combination,
first and second field-effect transistors of opposite conductivity types with each having drain and source electrodes separated by a channel defining a conductive path for said transistors, and a control electrode for controlling the conductance of said channel,
means for serially connecting together the drain-to-source electrode conductive paths of said transistors so that one transistor functions as a load on the other, means for directly connecting together the control electrodes of said transistors so as to provide a common bias terminal for said transistors, said logic gate exhibiting an input capacitance of a given value, a plurality of input terminals, a plurality of capacitors individually connecting an input terminal to said common bias terminal, said capacitors being selected to exhibit a capacitance substantially greater than said input capacitance, means for applying a plurality of binary input signals to said input terminals, and means for deriving from the junction of said drain-to-source electrode conductive paths of said transistors an output signal having a binary value equal to the binary value of a minority of input signals.

5. A minority gate comprising, in combination, a pair of field-effect transistors of opposite conductivity types with each having first and second electrodes separated by a channel defining a conductive path for said transistors, and a control electrode for controlling the conductivity of said channel, means for directly connecting together the control electrodes of said transistors to provide a common bias terminal, means for serially connecting together the first-to-second electrode conductive paths of said transistors so that one functions as a load on the other, means for capacitively applying a plurality of binary input signals to said common bias terminal, and means for deriving from the junction of said first-to-second electrode conductive paths of said pair of transistors an output signal having a binary value equal to the binary value of a minority of said input signals.

6. A minority gate comprising, in combination, a pair of field-effect transistors of opposite conductivity types with each having first and second electrodes separated by a channel defining a conductive path for said transistors, and a control electrode for controlling the conductivity of said channel, means for directly connecting together the control electrodes of said transistors to provide a common bias terminal, means for serially connecting together the first-to-second electrode conductive paths of said transistors so that one functions as a load on the other, means for applying a plurality of binary input signals to said common bias terminal, and means for deriving from the junction of said first-to-second electrode conductive paths of said pair of transistors an output signal having a binary value equal to the binary value of a minority of said input signals.

No references cited.

ARTHUR GAUSS, *Primary Examiner.*

J. BUSCH, *Assistant Examiner.*